(12) United States Patent
Shao et al.

(10) Patent No.: US 11,057,008 B2
(45) Date of Patent: Jul. 6, 2021

(54) POWER AMPLIFIER AND ELECTRONIC DEVICE

(71) Applicant: Radiawave Technologies Co., Ltd., Shenzhen (CN)

(72) Inventors: Yigao Shao, Shenzhen (CN); Yulin Tan, Shenzhen (CN); Jon Sweat Duster, Beaverton, OR (US); Haigang Feng, Shenzhen (CN); Ning Zhang, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 19 days.

(21) Appl. No.: 16/628,994

(22) PCT Filed: Sep. 18, 2018

(86) PCT No.: PCT/CN2018/106093
§ 371 (c)(1),
(2) Date: Jan. 6, 2020

(87) PCT Pub. No.: WO2019/052566
PCT Pub. Date: Mar. 21, 2019

(65) Prior Publication Data
US 2020/0127620 A1    Apr. 23, 2020

(30) Foreign Application Priority Data
Sep. 18, 2017   (CN) .......................... 201710846529.9

(51) Int. Cl.
*H03F 3/191*   (2006.01)
*H03F 3/21*    (2006.01)
(Continued)

(52) U.S. Cl.
CPC ............. *H03F 3/211* (2013.01); *H03F 1/483* (2013.01); *H03F 1/565* (2013.01); *H03F 3/213* (2013.01);
(Continued)

(58) Field of Classification Search
CPC ... H03F 3/45; H03F 3/68; H03F 3/191; H03F 3/193; H03F 2200/534; H03F 2200/537; H03F 2200/541
(Continued)

(56) References Cited

U.S. PATENT DOCUMENTS 4,688,006 A   8/1987 Wong et al.
6,081,157 A * 6/2000 Ikeda ................. H03H 11/1217
                                                    330/107
(Continued)

FOREIGN PATENT DOCUMENTS

CN    86201598 U    5/1987
CN    101510763 A   8/2009
(Continued)

OTHER PUBLICATIONS

Chen, 40Gb/s Amplifier with 3dB Bandwidth and High Gain, Semiconductor Information, Jun. 30, 2008, vol. 3, China.
(Continued)

*Primary Examiner* — Steven J Mottola
(74) *Attorney, Agent, or Firm* — Westbridge IP LLC

(57) ABSTRACT

The present disclosure provides a power amplifier and an electrical device. The two-stage power amplifier architecture is tuned staggered before power combining. A previous stage matching network and its input matching are split into a cascaded staggered tuning, such that the center frequency is at frequency point 1 less than the design frequency point and frequency point 2 greater than design frequency point, and then the power combining stage is tuned at the design
(Continued)

frequency point. At advanced process nodes (such as 65 nm or below), compared with the known architecture, in-band signal quality and out-of-band filtering effect of the power amplifier chip integrating this architecture will be better when using the same number of transformers (same area), the reliability will be better. Due to its good flatness within the band, this architecture is especially suitable for carrier aggregation communication occasions.

16 Claims, 11 Drawing Sheets

(51) Int. Cl.
| | | |
|---|---|---|
| *H03F 1/48* | (2006.01) | |
| *H03F 1/56* | (2006.01) | |
| *H03F 3/213* | (2006.01) | |
| *H03F 3/45* | (2006.01) | |

(52) U.S. Cl.
CPC ..... *H03F 3/4521* (2013.01); *H03F 2200/222* (2013.01); *H03F 2200/318* (2013.01); *H03F 2200/451* (2013.01); *H03F 2203/21103* (2013.01); *H03F 2203/21142* (2013.01); *H03F 2203/45051* (2013.01); *H03F 2203/45374* (2013.01)

(58) Field of Classification Search
USPC ........ 330/165, 188, 195, 252, 295, 302, 305
See application file for complete search history.

(56) References Cited

U.S. PATENT DOCUMENTS

| | | | |
|---|---|---|---|
| 7,652,539 | B2 | 1/2010 | Gao et al. |
| 2016/0072443 | A1* | 3/2016 | Mizokami ............... H03F 3/211 330/295 |

FOREIGN PATENT DOCUMENTS

| | | |
|---|---|---|
| CN | 101895262 A | 11/2010 |
| CN | 101997496 A | 3/2011 |
| CN | 105978515 A | 9/2016 |
| CN | 107592085 A | 1/2018 |

OTHER PUBLICATIONS

Chowdhury et al., A Fully Integrated Dual-Mode Highly Linear 2.4 GHz CMOS Power Amplifier for 4G WiMax Applications, IEEE Journal of Solid-state Circuits, Dec. 2009, pp. 3393-3402, vol. 44, No. 12.
First Office Action in counterpart Chinese application 201710846529. 9, dated Apr. 2, 2018.
International Search Report in corresponding PCT application PCT/CN2018/106093, dated Dec. 20, 2018.
Tan et al., CMOS Power Amplifier Design for Wireless Connectivity Applications: a Highly Linear WLAN Power Amplifier in Advanced SoC CMOS, RF and mm-Wave Power Generation in Silicon, 2016, pp. 61-88, Elsevier Inc.

* cited by examiner

POWER AMPLIFIER AND ELECTRONIC DEVICE

TECHNICAL FIELD

The present disclosure relates to the technical field of integrated circuits and electronic devices, and in particular, to a power amplifier chip and an electronic device.

BACKGROUND

In the related arts, with the shrinking of process nodes of the Radio Frequency (RF) chip, the design of the power amplifier integrated with the RF chip will become difficult. Especially, designing high-power power amplifiers on the advanced process nodes (such as 65 nm or below) will face challenges because of the poor tolerance of voltage swing and current swing.

Referring to FIG. 1 (D. Chowdhury, C. D. Hull, O. B. Degani, Y. Wang, and A. M. Niknejad, "A fully integrated dual-mode highly linear 2.4 Ghz CMOS power amplifier", IEEE J. Solid-State Circuits, vol. 43, no. 3, pp. 600-609, March 2009) and FIG. 2 (Y. Tan, H, Xu. (2016) CMOS power amplifier design for wireless connectivity applications: a highly linear WLAN power amplifier in advanced SoC CMOS, In RF and mm-wave Power Generation in Silicon (pp. 61-pp. 87). Elsevier Inc. DOI:10.1016/B978-0-12-408052-2.00008-6), FIG. 1 and FIG. 2 show two architectures of amplifiers commonly used in the related arts. As shown in FIG. 1, 1 represents an input transformer, 2 represents an inter-stage power splitter, 3 represents an output stage 2 (identical to stage 1), and 4 represents a power combiner. As shown in FIG. 2, 5 represents an input matching power splitter, 6 represents an inter-stage matching, and 7 represents an output matching power combiner. As can be seen from FIG. 1 and FIG. 2, there are many inductors in the existing architecture, the usable area is large, thus the cost is high, and the tuning bandwidth is relatively small.

In advanced CMOS process nodes (such as: 65 nm or below), the staggered tuning RF technology is combined with the power combining technology to enable power amplifiers to achieve better performance and lower area cost.

In theory, if n single-tuned amplifiers with the same bandwidth are tuned at the same frequency point, then:

$$r = \frac{\Delta f_{system}}{\Delta f_{single}} = \sqrt{2^{\frac{1}{n}} - 1} \quad (1)$$

r represents the bandwidth reduction rate, which is defined as the ratio of the bandwidth (HZ) of a cascaded circuit ($\Delta f_{system}$) to the bandwidth (HZ) of a single-stage circuit ($\Delta f_{single}$).

When the gain of each stage is equal, the system gain and system bandwidth satisfy the following formula:

$$\Delta f_{system} = \frac{f_t \sqrt{2^{\frac{1}{n}} - 1}}{A_{system}^{\frac{1}{n}}} \quad (2)$$

$A_{system}$ is the system gain of a cascaded circuit; $f_t$ is the transition frequency, which is related to the bias conditions and system properties, $$f_t = \frac{gm}{2\pi C_p}.$$

When the transformer resonates, as shown in FIG. 1 and FIG. 2, the 2-stage power amplifier, input matching, inter-stage matching, and output matching are all tuned at the same frequency point, the gain, band selectivity, in-band group delay, gain flatness, and system efficiency are highly coupled. Depending on different process and bias conditions, the transition frequency is different and the design space will become narrower, requiring complex compromises. The gain allocation and bias conditions will be optimized for efficiency, which will be severely limited in bandwidth.

SUMMARY

The main objective of the present disclosure is to provide a power amplifier, which aims to ensure the gain of the signal within the bandwidth, achieve flat group delay, improve the signal quality, reduce the usable area, increase reliability and efficiency.

In order to achieve the above objective, the present disclosure provides a power amplifier, including a staggered tuning circuit and a power combining circuit including two differential amplifiers. An output end of the staggered tuning circuit is connected to an input end of the power combining circuit.

The staggered tuning circuit is configured to: split a stage matching network and its input matching into a cascaded tuning circuit, and set center frequencies of parallel resonance networks of different stages to be different values through a setting relationship, and drive the power combining circuit of a subsequent stage.

The power combining circuit is configured to combine output powers of the two differential amplifiers to obtain a combined power amplification signal.

Optionally, the staggered tuning circuit includes an input matching network, a first amplifier, a second amplifier, a first inter-stage matching network, and a second inter-stage matching network; an output end of the input matching network is connected to an input end of the first amplifier; an output end of the first amplifier is connected to an input end of the first inter-stage matching network; an output end of the first inter-stage matching network is connected to an input end of the second amplifier; and an output end of the second amplifier is connected to an input end of the second inter-stage matching network.

Optionally, the staggered tuning circuit includes a first amplifier, a second amplifier, a first inter-stage matching network, and a second inter-stage matching network; an output end of the first amplifier is connected to an input end of the first inter-stage matching network; an output end of the first inter-stage matching network is connected to an input end of the second amplifier; and an output end of the second amplifier is connected to an input end of the second inter-stage matching network.

Optionally, the setting relationship is to multiply or divide a preset frequency value and a coordination coefficient to obtain center frequencies of parallel resonance networks of different stages; the preset frequency value is a center frequency of the power amplifier; and the coordination coefficient is obtained according to a required system bandwidth and its in-band flatness.

Optionally, the power combining circuit includes a third amplifier, a fourth amplifier, and a power combining resonance network; the third amplifier is in parallel with the fourth amplifier; and an output end of the third amplifier and an output end of the fourth amplifier are both connected to an input end of the power combining resonance network.

Optionally, the third amplifier and the fourth amplifier are both a cascaded three-stage differential amplifier; the third amplifier and the fourth amplifier have a same internal structure, and each includes a first deep N-well N-MOS transistor, a second deep N-well N-MOS transistor, a third deep N-well N-MOS transistor, a fourth deep N-well N-MOS transistor, a first N-MOS transistor, a second N-MOS transistor, a first resistor, a second resistor, a third resistor, a fourth resistor, a fifth resistor, a sixth resistor, a seventh resistor, and an eighth resistor; a deep N-well of the first deep N-well N-MOS transistor is connected to a first end of the first resistor, a second end of the first resistor is connected to a first end of the second resistor and connected to a power supply voltage, and a second end of the second resistor is connected to a deep N-well of the second deep N-well N-MOS transistor; a body end of the first deep N-well N-MOS transistor is connected to a first end of the third resistor, a second end of the third resistor is connected to a source of the first deep N-well N-MOS transistor and connected to a drain of the third deep N-well N-MOS transistor; a body end of the second deep N-well N-MOS transistor is connected to a first of the fourth resistor, a second end of the fourth resistor is connected to a source of the second deep N-well N-MOS transistor and connected to a drain of the fourth deep N-well N-MOS transistor; a deep N-well of the third deep N-well N-MOS transistor is connected to a first end of the fifth resistor, a second end of the fifth resistor is connected to a first end of the sixth resistor and connected to the power supply voltage, a second end of the sixth resistor is connected to a deep N-well of the fourth deep N-well N-MOS transistor; a body end of the third deep N-well N-MOS transistor is connected to a first end of the seventh resistor, a second end of the seventh resistor is connected to a source of the third deep N-well N-MOS transistor and connected to a drain of the first N-MOS transistor; a body end of the fourth deep N-well N-MOS transistor is connected to a first end of the eighth resistor, a second end of the eighth resistor is connected to a source of the fourth deep N-well N-MOS transistor and connected to a drain of the second N-MOS transistor; and a source of the first N-MOS transistor is connected to a source of the second N-MOS transistor and grounded.

Optionally, the first deep N-well N-MOS transistor and the second deep N-well N-MOS transistor are both a deep N-well normal voltage threshold thick gate oxide N-MOS transistor.

Optionally, the third deep N-well N-MOS transistor and the fourth deep N-well N-MOS transistor are both a deep N-well low voltage threshold thin gate oxide N-MOS transistor.

Optionally, the first N-MOS transistor and the second N-MOS transistor are both a low voltage threshold thin gate oxide N-MOS transistor.

The present disclosure further provides an electronic device, including a power amplifier. The power amplifier includes a staggered tuning circuit and a power combining circuit including two differential amplifiers. An output end of the staggered tuning circuit is connected to an input end of the power combining circuit.

The staggered tuning circuit is configured to: split a previous stage matching network and its input matching into a cascaded tuning circuit, and set center frequencies of parallel resonance networks of different stages to be different values through a setting relationship, and drive the power combining circuit of a subsequent stage.

The power combining circuit is configured to combine output powers of the two differential amplifiers to obtain a combined power amplification signal.

Optionally, the staggered tuning circuit includes an input matching network, a first amplifier, a second amplifier, a first inter-stage matching network, and a second inter-stage matching network; an output end of the input matching network is connected to an input end of the first amplifier; an output end of the first amplifier is connected to an input end of the first inter-stage matching network; an output end of the first inter-stage matching network is connected to an input end of the second amplifier; and an output end of the second amplifier is connected to an input end of the second inter-stage matching network.

Optionally, the staggered tuning circuit includes a first amplifier, a second amplifier, a first inter-stage matching network, and a second inter-stage matching network; an output end of the first amplifier is connected to an input end of the first inter-stage matching network; an output end of the first inter-stage matching network is connected to an input end of the second amplifier; and an output end of the second amplifier is connected to an input end of the second inter-stage matching network.

Optionally, the setting relationship is to multiply or divide a preset frequency value and a coordination coefficient to obtain center frequencies of parallel resonance networks of different stages; the preset frequency value is a center frequency of the power amplifier; and the coordination coefficient is obtained according to a required system bandwidth and its in-band flatness.

Optionally, the power combining circuit includes a third amplifier, a fourth amplifier, and a power combining resonance network; the third amplifier is in parallel with the fourth amplifier; and an output end of the third amplifier and an output end of the fourth amplifier are both connected to an input end of the power combining resonance network.

Optionally, the third amplifier and the fourth amplifier are both a cascaded three-stage differential amplifier; the third amplifier and the fourth amplifier have a same internal structure, and each includes a first deep N-well N-MOS transistor, a second deep N-well N-MOS transistor, a third deep N-well N-MOS transistor, a fourth deep N-well N-MOS transistor, a first N-MOS transistor, a second N-MOS transistor, a first resistor, a second resistor, a third resistor, a fourth resistor, a fifth resistor, a sixth resistor, a seventh resistor, and an eighth resistor; a deep N-well of the first deep N-well N-MOS transistor is connected to a first end of the first resistor, a second end of the first resistor is connected to a first end of the second resistor and connected to a power supply voltage, and a second end of the second resistor is connected to a deep N-well of the second deep N-well N-MOS transistor; a body end of the first deep N-well N-MOS transistor is connected to a first end of the third resistor, a second end of the third resistor is connected to a source of the first deep N-well N-MOS transistor and connected to a drain of the third deep N-well N-MOS transistor; a body end of the second deep N-well N-MOS transistor is connected to a first of the fourth resistor, a second end of the fourth resistor is connected to a source of the second deep N-well N-MOS transistor and connected to a drain of the fourth deep N-well N-MOS transistor; a deep N-well of the third deep N-well N-MOS transistor is connected to a first end of the fifth resistor, a second end of the fifth resistor is connected to a first end of the sixth resistor and connected to the power supply voltage, a second end of the sixth resistor is connected to a deep N-well of the fourth deep N-well N-MOS transistor; a body end of the third deep N-well N-MOS transistor is connected to a first end of the seventh resistor, a second end of the seventh resistor is connected to a source of the third deep N-well N-MOS transistor and connected to a drain of the first N-MOS transistor; a body end of the fourth deep N-well N-MOS transistor is connected to a first end of the eighth resistor, a second end of the eighth resistor is connected to a source of the fourth deep N-well N-MOS transistor and connected to a drain of the second N-MOS transistor; and a source of the first N-MOS transistor is connected to a source of the second N-MOS transistor and grounded.

Optionally, the first deep N-well N-MOS transistor and the second deep N-well N-MOS transistor are both a deep N-well normal voltage threshold thick gate oxide N-MOS transistor.

Optionally, the third deep N-well N-MOS transistor and the fourth deep N-well N-MOS transistor are both a deep N-well low voltage threshold thin gate oxide N-MOS transistor.

Optionally, the first N-MOS transistor and the second N-MOS transistor are both a low voltage threshold thin gate oxide N-MOS transistor.

In the technical solutions of the present disclosure, the two-stage power amplifier architecture is tuned staggered before power combining. Besides, in the present disclosure, a previous stage matching network and its input matching are split into a cascaded staggered tuning, such that its center frequency is at frequency 1 and frequency 2, and the last stage is tuned at frequency 3. Since the staggered tuning split in the previous stage widens the bandwidth, so even if the tuning network in the last stage reduces the bandwidth, it will not weaken too much. At advanced process nodes (such as 65 nm or below), compared with the known architecture, in-band signal quality and band filtering of the power amplifier chip integrating this architecture will be better when using the same number of transformers (same area). Due to its good flatness within the band, this architecture is especially suitable for carrier aggregation communication occasions.

BRIEF DESCRIPTION OF THE DRAWINGS

In order to more clearly illustrate the embodiments of the present disclosure or the technical solutions in the related art, the drawings used in the embodiments or the related art will be briefly described below. Obviously, the drawings in the following description are only some embodiments of the present disclosure. It will be apparent to those skilled in the art that other figures can be obtained from the structures illustrated in the drawings without the inventive effort.

The realization of the objective, functional characteristics, advantages of the present disclosure are further described with reference to the accompanying drawings.

DETAILED DESCRIPTION OF THE EMBODIMENTS

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

It is to be understood that, all of the directional instructions in the embodiments of the present disclosure (such as up, down, left, right, front, rear . . . ) can only be used for explaining relative position relations, moving condition of the elements under a special form (referring to figures), and so on, if the special form changes, the directional instructions changes accordingly.

In addition, the descriptions, such as the "first", the "second" in the embodiment of present disclosure, can only be used for describing the aim of description, and cannot be understood as indicating or suggesting relative importance or impliedly indicating the number of the indicated technical feature. Therefore, the feature indicated by the "first", the "second" can express or impliedly include at least one feature. Besides, the technical solution of each embodiment can be combined with each other, however the technical solution must base on that the ordinary skill in that art can realize the technical solution, when the combination of the technical solutions is contradictory or cannot be realized, it should consider that the combination of the technical solutions does not exist, and is beyond the protection scope of the present disclosure.

The present disclosure provides a power amplifier.

Figure 1:
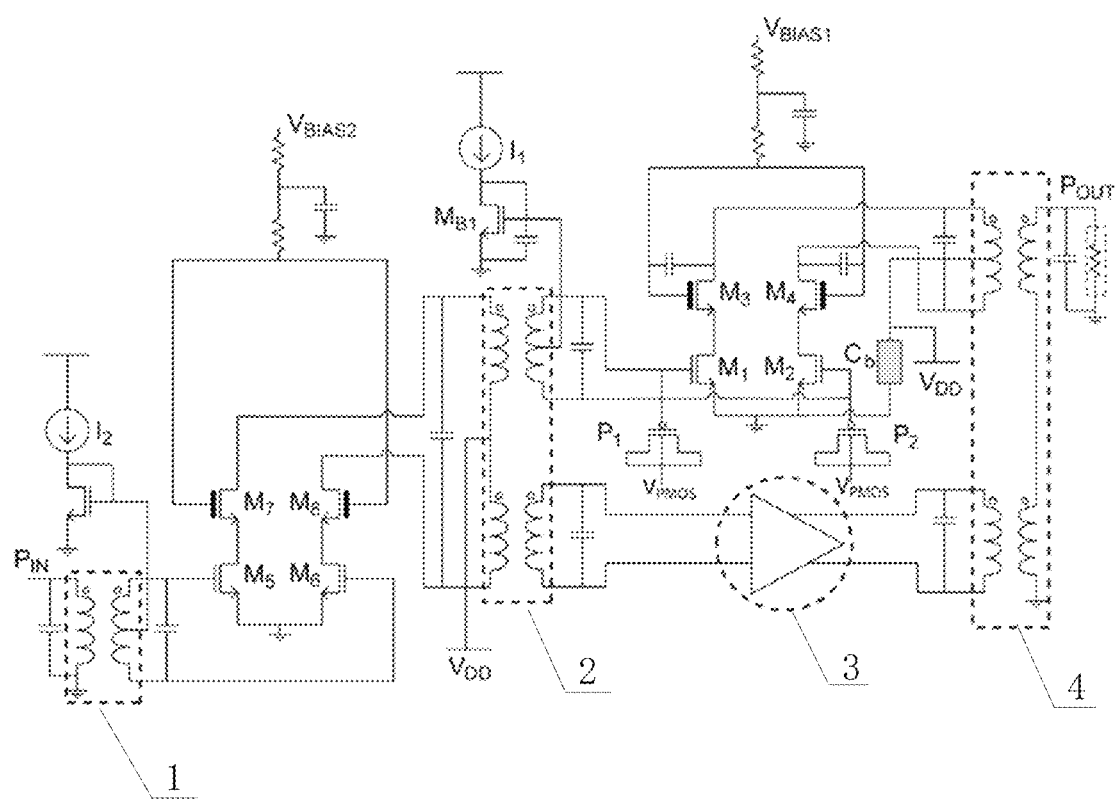
FIG. 1 is a schematic structural diagram of a first known amplifier structure.
Figure 2:
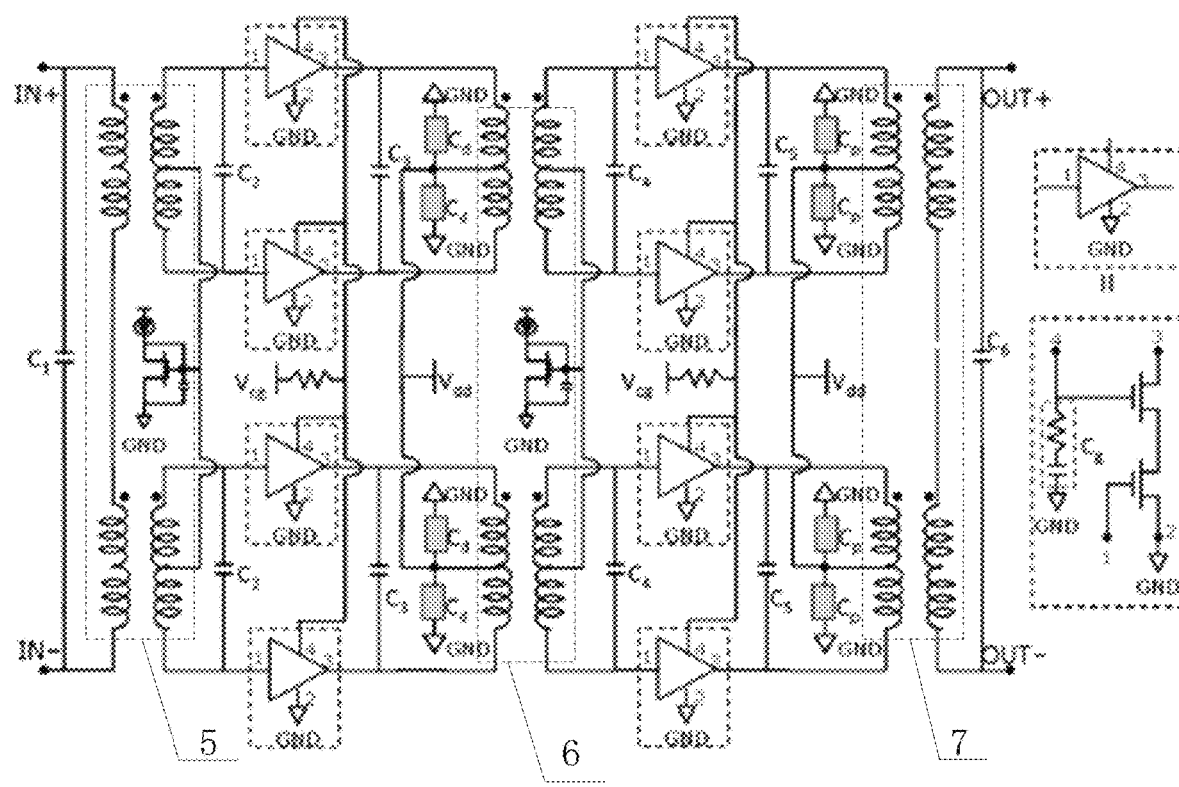
FIG. 2 is a schematic structural diagram of a second known amplifier structure.
Figure 3:
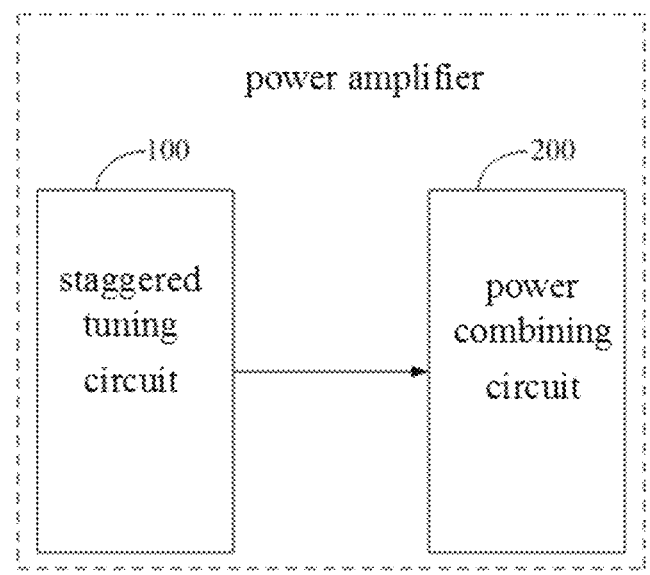
FIG. 3 is a schematic diagram of functional modules of a power amplifier according to the present disclosure.

As shown in FIG. 3, the power amplifier of the present disclosure includes a staggered tuning circuit 100 and a power combining circuit 200 including two differential amplifiers. An output end of the staggered tuning circuit 100 is connected to an input end of the power combining circuit 200.

The staggered tuning circuit 100 is configured to split a previous stage matching network and its input matching into a cascaded tuning circuit, and set center frequencies of parallel resonance networks of different stages to be different values through a setting relationship, and drive the power combining circuit 200 of a subsequent stage.

The power combining circuit 200 is configured to combine output powers of the two differential amplifiers to obtain a combined power amplification signal.

In the present disclosure, the two-stage power amplifier architecture is tuned staggered before power combining, compared with the known architecture, in-band signal quality and band filtering will be better when using the same number of transformers (same area). Due to its good flatness within the band, this architecture is especially suitable for carrier aggregation communication occasions.

The staggered tuning circuit 100 of the present disclosure includes an input stage matching staggered tuning circuit and without the input stage matching staggered tuning circuit.

Figure 4:
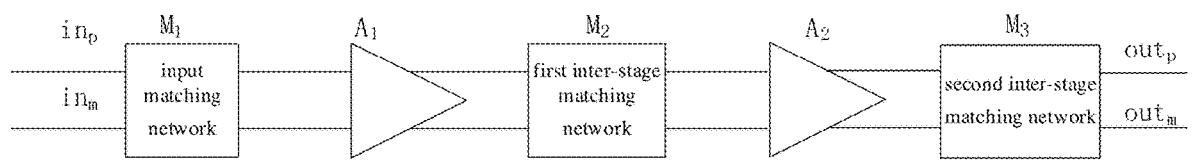
FIG. 4 is a schematic structural diagram of the power amplifier with an input stage matching staggered tuning circuit according to a first embodiment of the present disclosure.
Figure 5:
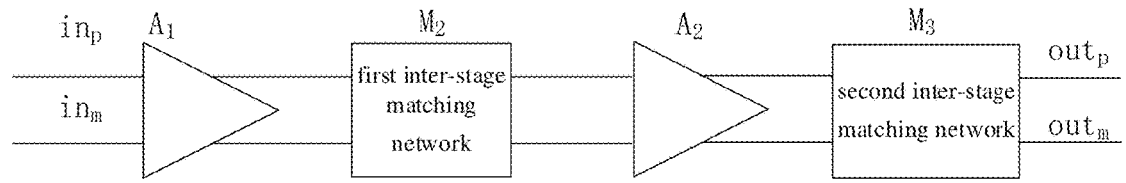
FIG. 5 is a schematic structural diagram of the power amplifier without the input stage matching staggered tuning circuit according to a second embodiment of the present disclosure.

Referring to FIG. 4, in an embodiment of the present disclosure, the staggered tuning circuit 100 includes an input matching network $M_1$, a first amplifier $A_1$, a second amplifier $A_2$, a first inter-stage matching network $M_2$, and a second inter-stage matching network $M_3$. An output end of the input matching network $M_1$ is connected to an input end of the first amplifier $A_1$. An output end of the first amplifier $A_1$ is connected to an input end of the first inter-stage matching network $M_2$. An output end of the first inter-stage matching network $M_2$ is connected to an input end of the second amplifier $A_2$. An output end of the second amplifier $A_2$ is connected to an input end of the second inter-stage matching network $M_3$.

Set the center frequencies of the first inter-stage matching network $M_2$ and the second inter-stage matching network $M_3$ at different values staggered by the setting relationship. Specially, the first inter-stage matching network $M_2$ is tuned at $f_0$/alpha, and the second inter-stage matching network $M_3$ is tuned at $f_0$×alpha. Generally $f_0$ is at the center frequency of the power amplifier. The parameter alpha is a dimensionless design parameter, which is selected according to the required system bandwidth and its in-band flatness. According to the present embodiment, a previous stage matching network and its input matching are split into a cascaded staggered tuning, such that its center frequency is at frequency 1 and frequency 2, and the last stage is tuned at frequency 3. Since the staggered tuning split in the previous stage widens the bandwidth, so even if the tuning network in the last stage reduces the bandwidth, it will not weaken too much.

Figure 6:
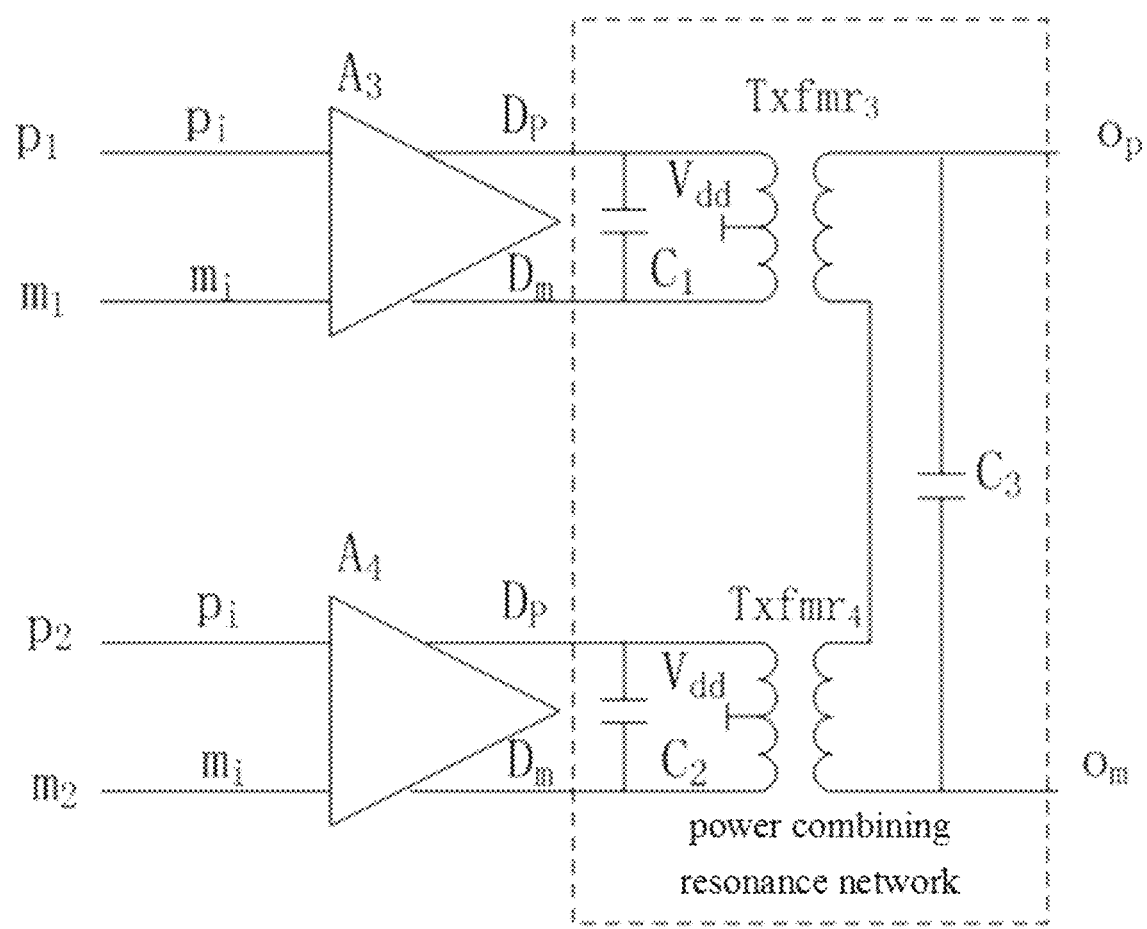
FIG. 6 is a schematic diagram of a power combining circuit of the power amplifier according to a third embodiment of the present disclosure.

Referring to FIG. 6, according to an embodiment of the present disclosure, the power combining circuit 200 includes a third amplifier $A_3$, a fourth amplifier $A_4$, and a power combining resonance network. The third amplifier $A_3$ is in parallel with the fourth amplifier $A_4$; and an output end of the third amplifier $A_3$ and an output end of the fourth amplifier $A_4$ are both connected to an input end of a power combining resonance network. In the present embodiment, two amplifiers are connected in parallel to a power combining resonance network, which saves the number of transformers used.

Figure 7:
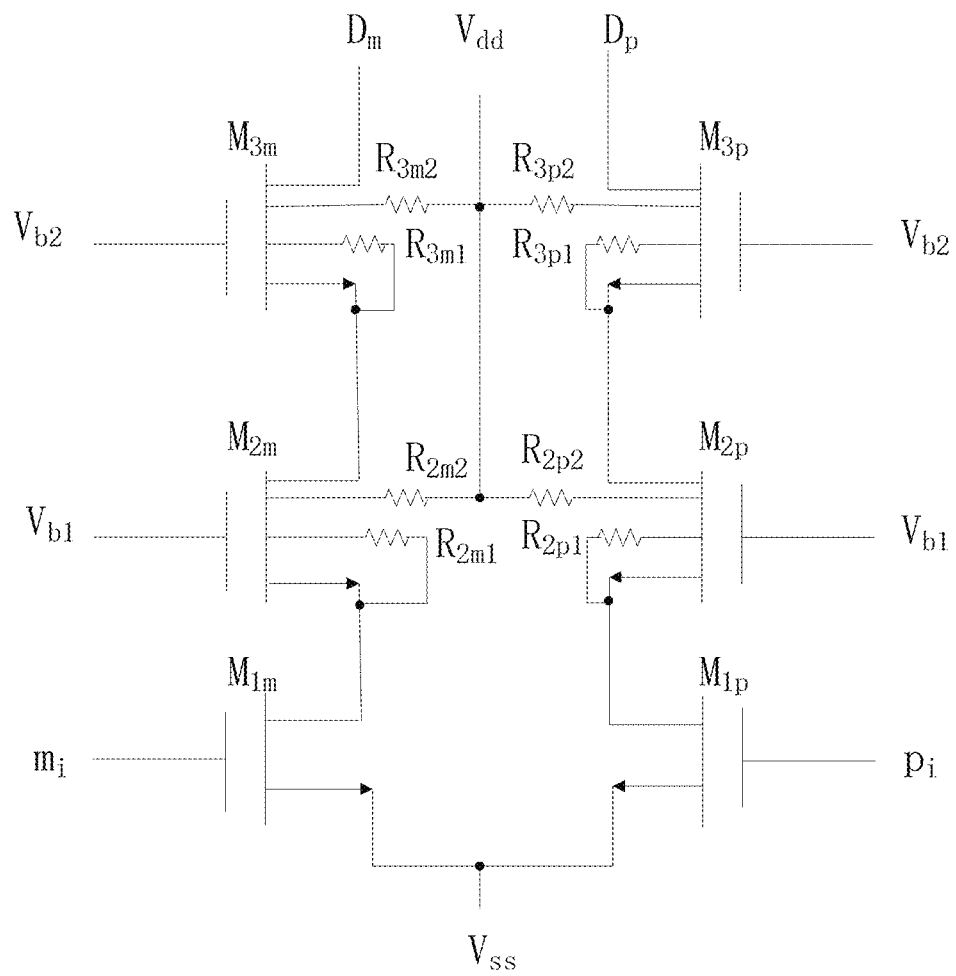
FIG. 7 is a schematic diagram of an internal amplifier circuit of the power combining circuit of the power amplifier according to a fourth embodiment of the present disclosure.

In the present disclosure, the third amplifier $A_3$ and the fourth amplifier $A_4$ are both a cascaded three-stage differential amplifier. Referring to FIG. 7, the third amplifier $A_3$ and the fourth amplifier $A_4$ have the same internal structure, and each includes a first deep N-well N-MOS transistor $M_{3m}$, a second deep N-well N-MOS transistor $M_{3p}$, a third deep N-well N-MOS transistor $M_{2m}$, a fourth deep N-well N-MOS transistor $M_{2p}$, a first N-MOS transistor $M_{1m}$, a second N-MOS transistor $M_{1p}$, a first resistor $R_{3m2}$, a second resistor $R_{3p2}$, a third resistor $R_{3m1}$, a fourth resistor $R_{3p2}$, a fifth resistor $R_{2m2}$, a sixth resistor $R_{2p2}$, a seventh resistor $R_{2m1}$, and an eighth resistor $R_{2p1}$.

In an optional embodiment, the first deep N-well N-MOS transistor $M_{3m}$ and the second deep N-well N-MOS transistor $M_{3p}$ are both a deep N-well normal voltage threshold thick gate oxide N-MOS transistor, which are 6-port devices. Its deep N-well is biased at a higher supply voltage through a large resistor ($R_{3m2}$, $R_{3p2}$); its body ends are connected to its own source through a large resistor ($R_{3m1}$, $R_{3p1}$, 10 Kohm). Its gate is biased at a higher voltage, so that the high-voltage swing on $p_m$, $p_p$ does not exceed its drain-gate tolerance limit. The third deep N-well N-MOS transistor $M_{2m}$ and the fourth deep N-well N-MOS transistor $M_{2p}$ are both a deep N-well low voltage threshold thin gate oxide N-MOS transistor, which are 6-port devices. Its deep N-well is biased at a higher supply voltage through a large resistor ($R_{2m2}$, $R_{2p2}$); its body ends are connected to its own source through a large resistor ($R_{2m1}$, $R_{2p1}$, 10 Kohm). The first N-MOS transistor $M_{1m}$ and the second N-MOS transistor $M_{1p}$ are both a low voltage threshold thin gate oxide N-MOS transistor, which are 4-port devices.

The threshold voltage arrangements of the first N-MOS transistor $M_{1m}$, the second N-MOS transistor $M_{1p}$, the third deep N-well N-MOS transistor $M_{2m}$, and the fourth deep N-well N-MOS transistor $M_{2p}$ are to reduce the on-resistance $R_{on}$, thereby reducing the knee voltage $V_{knee}$; Because $R_{on}$, $V_{knee}$ and the maximum current $I_{max}$ have the following formula:

$$V_{knee} = I \times R_{on} \qquad (3)$$

thereby improving the efficiency of the power amplifier. The uppermost first deep N-well N-MOS transistor $M_{3m}$ and the second deep N-well N-MOS transistor $M_{3p}$ exist for reliability design, to make the voltage drop swing of each port of the two thin gate oxide layers within the tolerance range.

The on-chip power combining method will also improve efficiency than the method that uses a larger conversion ratio matching network to transmit power without using a combining method; which is as shown in the following formula:

$$\eta_{tf} = \frac{Q_{ind}^2 + 1}{Q_{ind}^2 + \frac{r + \sqrt{r^2 + 4Q_{ind}(r-1)}}{2}} \qquad (4)$$

$\eta_{tf}$ is the power transmission efficiency of the transformer;
$Q^2_{ind}$ is its quality factor;
r represents the impedance conversion ratio.

Referring to FIG. 7, in an optional embodiment, a deep N-well of the first deep N-well N-MOS transistor $M_{3m}$ is connected to a first end of the first resistor $R_{3m2}$, a second end of the first resistor $R_{3m2}$ is connected to a first end of the second resistor $R_{3p2}$ and connected to a power supply voltage $V_{dd}$, a second end of the second resistor $R_{3p2}$ is connected to a deep N-well of the second deep N-well N-MOS transistor $M_{3p}$. A body end of the first deep N-well N-MOS transistor $M_{3m}$ is connected to a first end of the third resistor $R_{3m1}$, a second end of the third resistor $R_{3m1}$ is connected to a source of the first deep N-well N-MOS transistor $M_{3m}$ and connected to a drain of the third deep N-well N-MOS transistor $M_{2m}$. A body end of the second deep N-well N-MOS transistor $M_{3p}$ is connected to a first of the fourth resistor $R_{3p2}$, a second end of the fourth resistor $R_{3p2}$ is connected to a source of the second deep N-well N-MOS transistor $M_{3p}$ and connected to a drain of the fourth deep N-well N-MOS transistor $M_{2p}$. A deep N-well of the third deep N-well N-MOS transistor $M_{2m}$ is connected to a first end of the fifth resistor $R_{2m2}$, a second end of the fifth resistor $R_{2m2}$ is connected to a first end of the sixth resistor $R_{2p2}$ and connected to the power supply voltage $V_{dd}$, a second end of the sixth resistor $R_{2p2}$ is connected to a deep N-well of the fourth deep N-well N-MOS transistor $M_{2p}$. A body end of the third deep N-well N-MOS transistor $M_{2m}$ is connected to a first end of the seventh resistor $R_{2m1}$, a second end of the seventh resistor $R_{2m1}$ is connected to a source of the third deep N-well N-MOS transistor $M_{2m}$ and connected to a drain of the first N-MOS transistor $M_{1m}$. A body end of the fourth deep N-well N-MOS transistor $M_{2p}$ is connected to a first end of the eighth resistor $R_{2p1}$, a second end of the eighth resistor $R_{2p1}$ is connected to a source of the fourth deep N-well N-MOS transistor $M_{2p}$ and connected to a drain of the second N-MOS transistor $M_{1p}$. A source of the first N-MOS transistor $M_{2p}$ is connected to a source of the second N-MOS transistor $M_{1p}$ and connected to Vss.

In an optional embodiment, all amplifiers of the present disclosure are biased under deep AB, and the setting of the transistor parameters and the bias voltage should enable deep AB operation. The design parameters of $A_1$ and $A_2$ are the same and the type is AX; the design parameters of $A_3$ and $A_4$ are the same and the type is AY. In AX, the widths of the three transistors from top to bottom are AX.W1, AX.W2, and AX.W3 respectively; then in AY, the widths of the three transistors are AY.W1, AY.W2, and AY.W3. AX.W1=a×AY.W1, AX.W2=a×AY.W2, AX.W3=a×AY.W3. And, a is a number between one thirty-two and one-half.

In an optional embodiment, the transformer of the present disclosure refers to the on-chip planar spiral transformer and stacked spiral transformer commonly used in CMOS radio frequency integrated circuits. The design should be based on the application and area constraints. The appropriate k (mutual inductance), $L_1$ (self-inductance of the primary coil), $L_2$ (self-inductance of the secondary coil), R, and C is selected to design enough gain and sufficient bandwidth. Besides, the resonant transformer network needs to be designed to meet the matching requirements. For the Txfmr3 and Txfmr4 resonant networks, they need to be designed to meet the optimal output power matching of the output saturation power Psat. For the resonant networks of $Txfmr_1$ and $Txfmr_2$, they need to be designed to meet the flatness requirements of the staggered tuning bandwidth and achieve a power ratio a.

Figure 8:
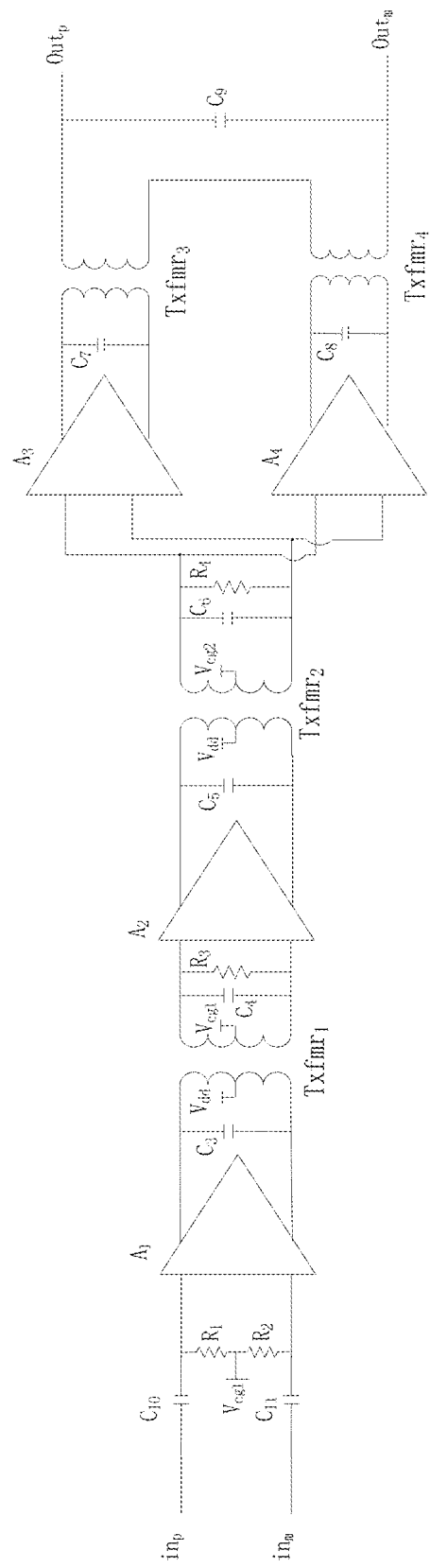
FIG. 8 is a schematic diagram of a power amplifier architecture when the power amplifier does not include an input stage matching according to a fifth embodiment of the present disclosure.
Figure 9:
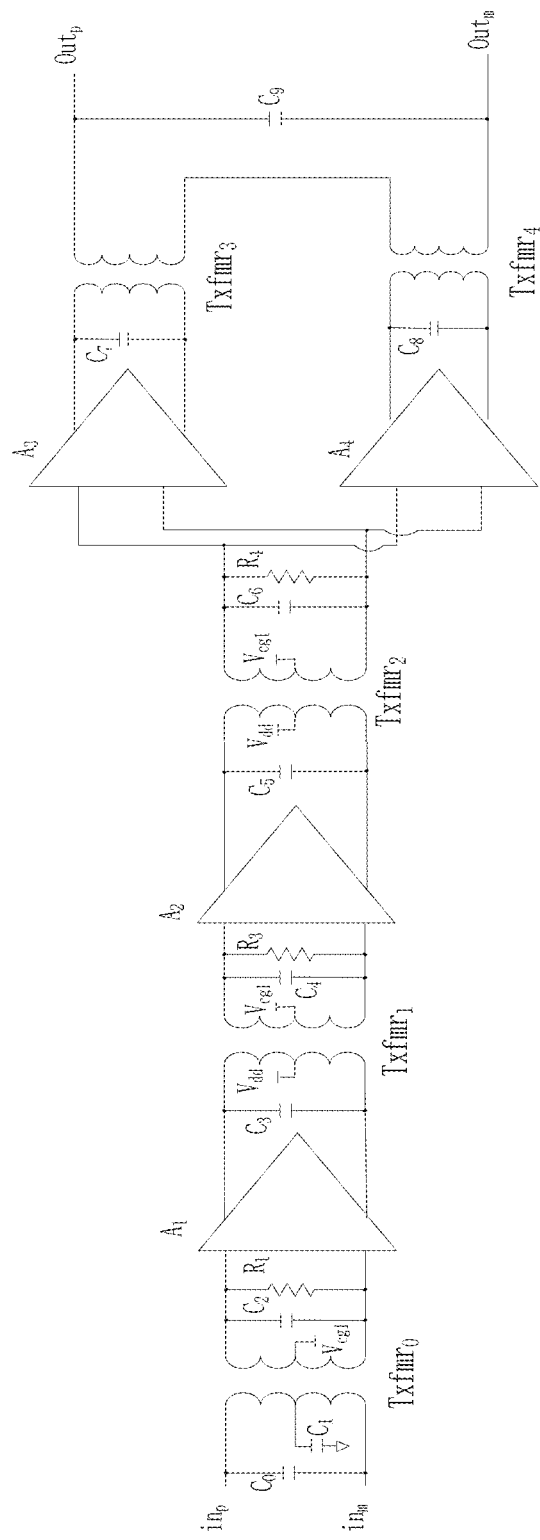
FIG. 9 is a schematic diagram of the power amplifier architecture when the power amplifier includes the input stage matching according to a sixth embodiment of the present disclosure.

The overall circuit architecture of the staggered tuning circuit 100 and the power combining circuit 200 connected in the present disclosure is as follows:

Referring to FIG. 8 and FIG. 9, $V_{dd}$ is the supply voltage, Vcg1 is the bias voltage; $A_1$, $A_2$, $A_3$, and $A_4$ are amplifiers. As shown in FIG. 9, $C_0$ and $C_2$ are tuning capacitors. $C_1$ plays the role of suppressing even harmonics and common mode components. $C_3$, $C_4$, $C_5$, $C_6$, $C_7$, $C_8$ and $C_9$ are tuning capacitors. The tuning capacitor can be partially implemented by a programmable switched capacitor array and should be covered by this patent. As shown in FIG. 8, $C_{10}$ and $C_{11}$ are AC coupling capacitors. $Txfmr_0$, $Txfmr_1$, $Txfmr_2$ transformers have center taps on the primary and secondary coils, which are 6-port devices. A RC series array should be added to the center tap of the main coil to suppress self-excitation and stabilize the supply voltage. A capacitor can be optionally added to the center tap of the secondary coil to ground to suppress even-order harmonics and common-mode drift. $Txfmr_3$, $Txfmr_4$ transformers have no center tap in the secondary coil. $R_3$ and $R_4$ are the termination resistances of the secondary coil, which are selected according to the required system bandwidth and the flatness of the band. $R_1$ and $R_2$ are bias resistors, which generally have large resistances greater than 10 kOhm.

Referring to FIG. 8, when there is no input stage matching, the resonance network $M_2$ composed of $Txfmr_1$ and $C_3$, $C_4$, and $R_3$, and the resonance network $M_3$ composed of $Txfmr_2$ and $C_5$, $C_6$, and $R_4$ need to be designed in a form of staggered tuning that satisfies the flatness of the bandwidth and enables the power ratio a to be achieved.

Referring to FIG. 9, FIG. 9 is a schematic diagram of the power amplifier architecture when the power amplifier includes the input stage matching. The power combining resonant network composed of $Txfmr_3$, $Txfmr_4$ and $C_7$, $C_8$, and $C_9$ needs to be designed to meet the optimal output power matching of the output saturation power Psat. The input stage matching M1 composed of $Txfmr_0$, $C_0$, $C_1$, $C_2$ and $R_1$, the resonance network $M_2$ composed of $Txfmr_1$ and $C_3$, $C_4$, and $R_3$, and the resonance network $M_3$ composed of $Txfmr_2$ and $C_5$, $C_6$, and $R_4$ need to be designed in a form of staggered tuning that satisfies the flatness of the bandwidth and enables the power ratio a to be achieved.

In the present embodiment, at advanced process nodes, compared with the known architecture, in-band signal quality and band filtering of the power amplifier chip integrating this architecture will be better when using the same number of transformers (same area). Due to its good flatness within the band, this architecture is especially suitable for carrier aggregation communication occasions.

Figure 10:
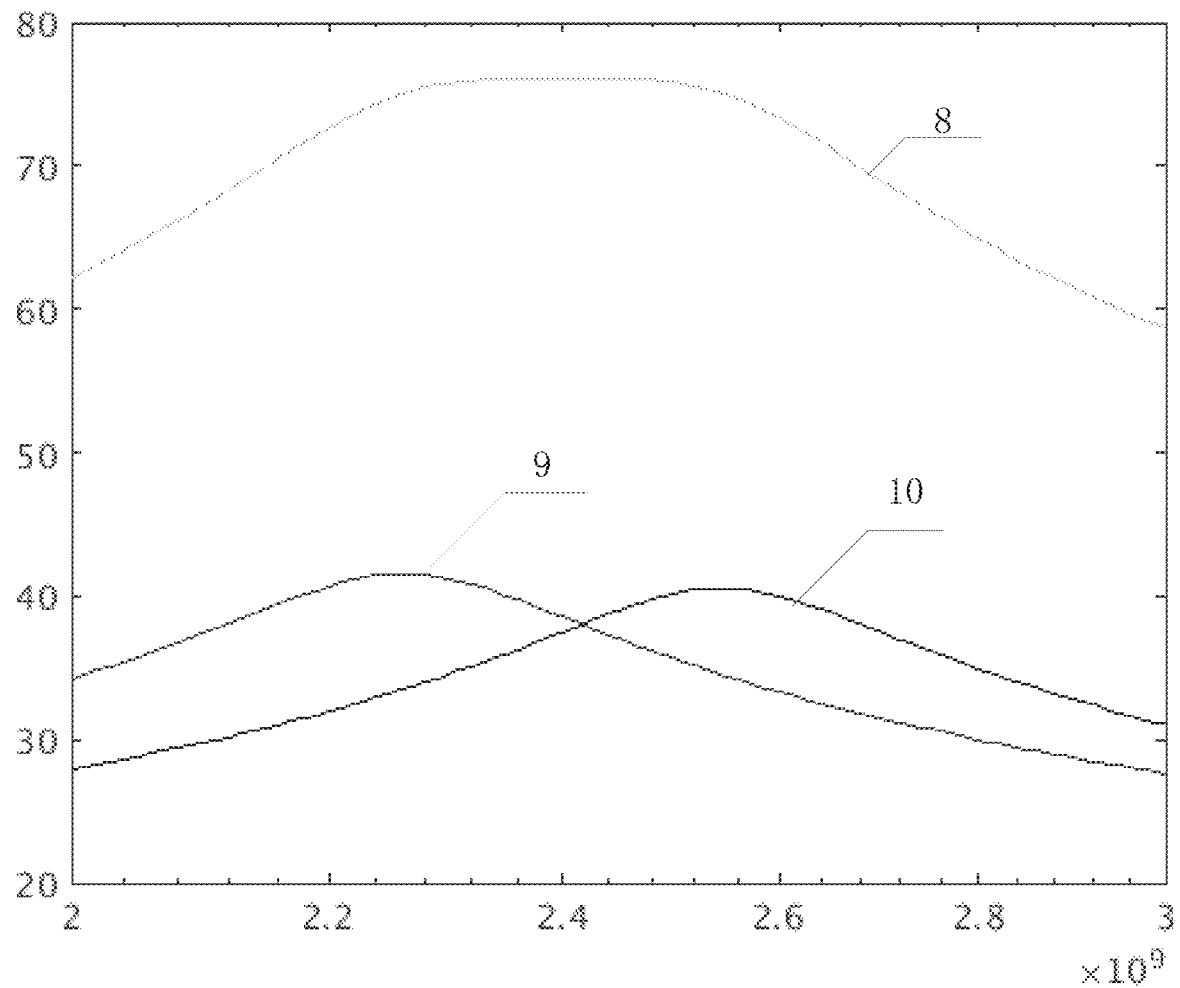
FIG. 10 is a schematic diagram of a frequency response of the power amplifier without an input matching stagger tuning according to the present disclosure.
Figure 11:
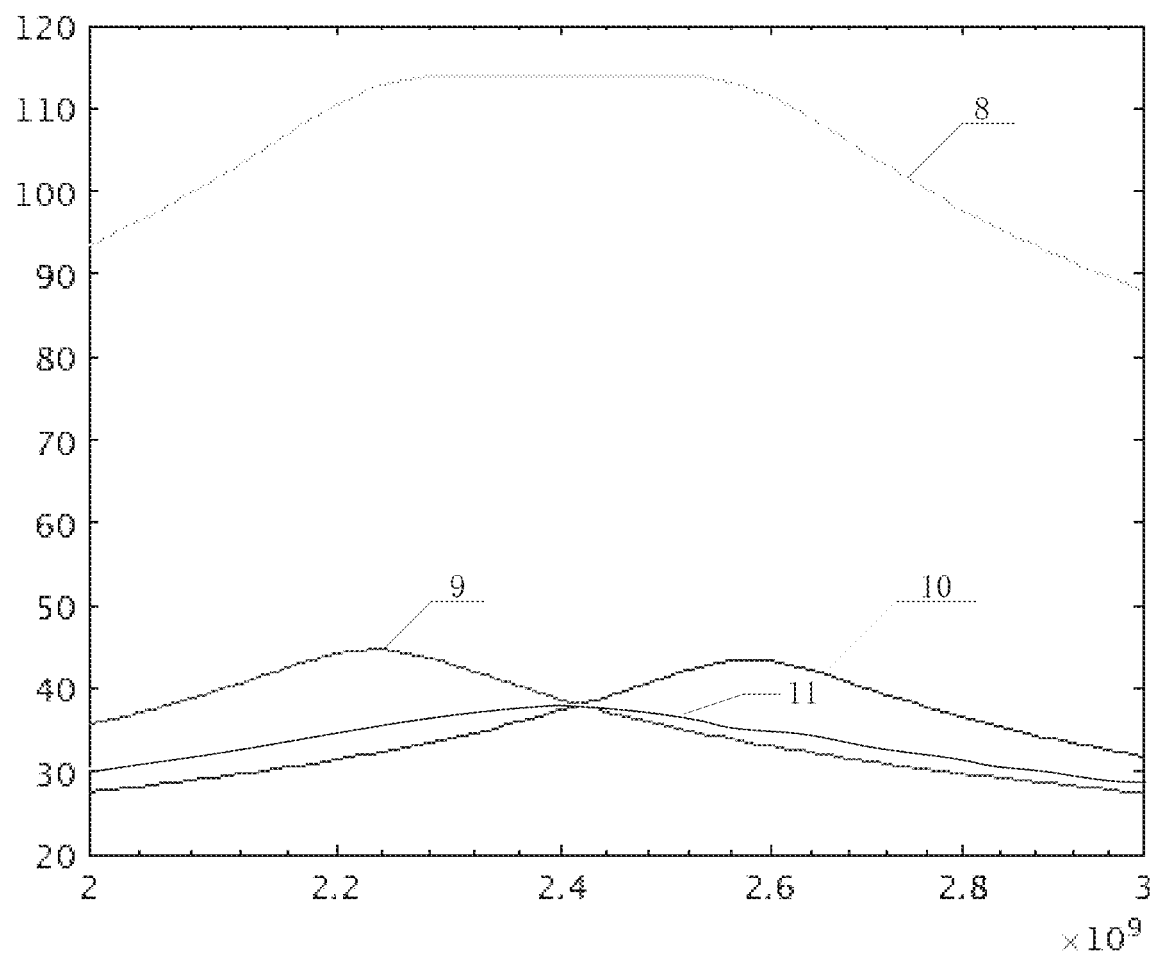
FIG. 11 is a schematic diagram of the frequency response of the power amplifier with the input matching stagger tuning according to the present disclosure.

Referring to FIG. 10, FIG. 10 is a schematic diagram of a frequency response of the power amplifier without an input matching stagger tuning. Referring to FIG. 11, FIG. 11 is a schematic diagram of the frequency response of the power amplifier with the input matching stagger tuning. In the Figure, the horizontal axis is frequency (Hz), and the vertical axis is the frequency response mode (dB). Line 8 is the frequency response curve of the system input to output (FIG. 8 corresponds to FIG. 10, FIG. 9 corresponds to FIG. 11). Line 9 is the frequency response of $A_1+M_1$, and its tuning frequency is at $f_0$/alpha. Line 10 is the frequency response of $A_2+M_2$, its tuning frequency is at $f_0$×alpha. Line 11 is the frequency response diagram of $M_1+A_0$. It assumes that the input matching is driven by $A_0$. $A_0$ is a driver amplifier to be added as appropriate, and is not drawn in the circuit (FIG. 9 or FIG. 8).

Figure 12:
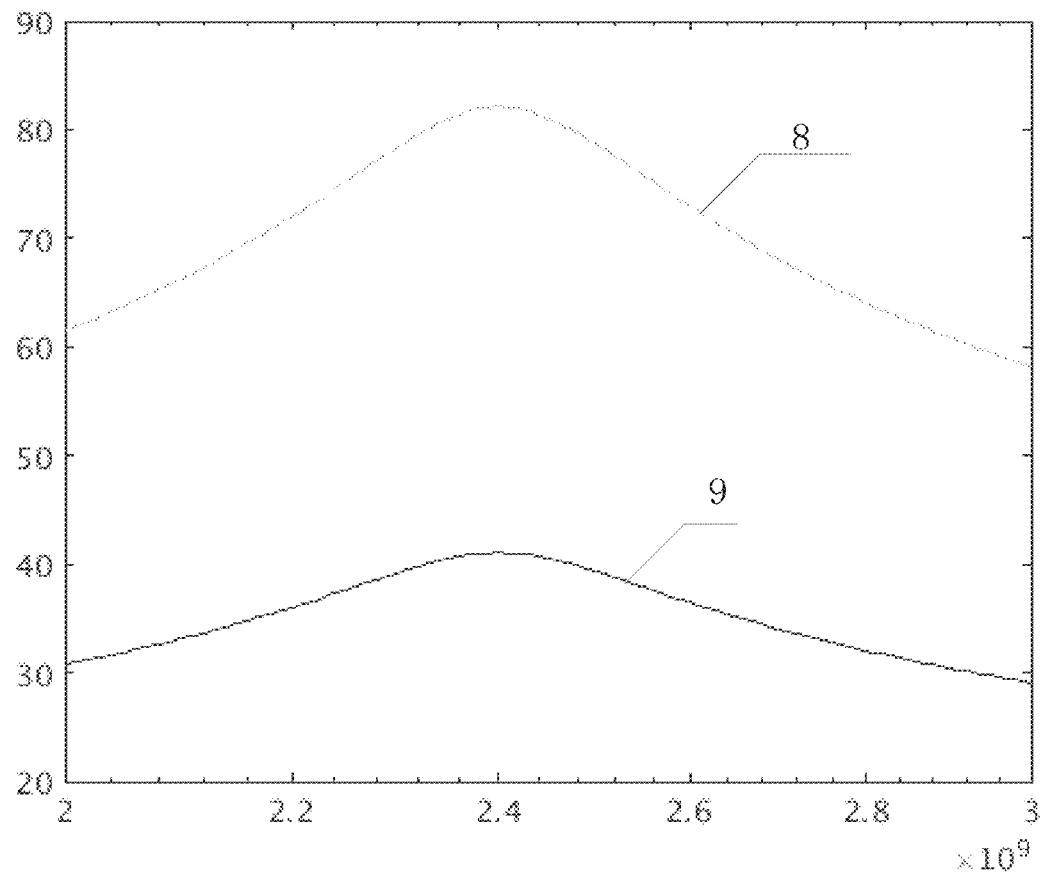
FIG. 12 is a schematic diagram of the frequency response during overlapping tuning.

Referring to FIG. 12, FIG. 12 is a schematic diagram of the frequency response during overlapping tuning. As shown in FIG. 12, Line 9 is the single frequency response of the amplifier tuned at the center frequency of 2.4G. When two amplifiers are cascaded, the frequency response of the system is shown by the green line. It can be seen that the bandwidth is reduced and the flatness of the in-band gain response is poor. Comparing FIG. 10 and FIG. 11 with FIG. 12, it can be seen that the in-bands in FIG. 10 and FIG. 11 are flattened and the bandwidth is increased, but the out-of-band suppression capability is not sacrificed.

The present disclosure further provides an electronic device. The electronic device includes a power amplifier as described above. The electronic device includes all the embodiments of the power amplifier described above, and therefore also has the same technical effects as the embodiments of the power amplifier, which will not be repeated here.

The above are only preferred embodiments of the present disclosure, and thus do not limit the scope of the present disclosure. Under the concept of the present disclosure, the equivalent structural transformations made by the present specification and the drawings are directly or indirectly applied to other related technical fields, and are included in the scope of the present disclosure.

What is claimed is:

1. A power amplifier, comprising a staggered tuning circuit and a power combining circuit comprising two differential amplifiers, wherein:
   an output end of the staggered tuning circuit is connected to an input end of the power combining circuit;
   the staggered tuning circuit is configured to:
      split a previous stage matching network and its input matching into a cascaded tuning circuit, and
      set center frequencies of parallel resonance networks of different stages to be different values through a setting relationship, and
      drive the power combining circuit of a subsequent stage; and
   the power combining circuit is configured to combine output powers of the two differential amplifiers to obtain a combined power amplification signal;
   the staggered tuning circuit comprises a first amplifier, a second amplifier, a first inter-stage matching network, and a second inter-stage matching network;
   an output end of the first amplifier is connected to an input end of the first inter-stage matching network;
   an output end of the first inter-stage matching network is connected to an input end of the second amplifier; and
   an output end of the second amplifier is connected to an input end of the second inter-stage matching network.

2. The power amplifier of claim 1, wherein:
   the staggered tuning circuit further comprises an input matching network,
   an output end of the input matching network is connected to an input end of the first amplifier.

3. The power amplifier of claim 1, wherein:
   the setting relationship is to multiply or divide a preset frequency value and a coordination coefficient to obtain center frequencies of parallel resonance networks of different stages;
   the preset frequency value is a center frequency of a working passband of the power amplifier; and
   the coordination coefficient is obtained according to a required system bandwidth and its in-band flatness.

4. The power amplifier of claim 1, wherein:
   the power combining circuit comprises a third amplifier, a fourth amplifier, and a power combining resonance network;
   the third amplifier is in parallel with the fourth amplifier; and
   an output end of the third amplifier and an output end of the fourth amplifier are both connected to an input end of the power combining resonance network.

5. The power amplifier of claim 4, wherein:
   the third amplifier and the fourth amplifier are both a cascaded three-stage differential amplifier;
   the third amplifier and the fourth amplifier have a same internal structure, and each comprises a first deep N-well N-MOS transistor, a second deep N-well N-MOS transistor, a third deep N-well N-MOS transistor, a fourth deep N-well N-MOS transistor, a first N-MOS transistor, a second N-MOS transistor, a first resistor, a second resistor, a third resistor, a fourth resistor, a fifth resistor, a sixth resistor, a seventh resistor, and an eighth resistor;
   a deep N-well of the first deep N-well N-MOS transistor is connected to a first end of the first resistor, a second end of the first resistor is connected to a first end of the second resistor and connected to a power supply voltage, and a second end of the second resistor is connected to a deep N-well of the second deep N-well N-MOS transistor;
   a body end of the first deep N-well N-MOS transistor is connected to a first end of the third resistor, a second end of the third resistor is connected to a source of the first deep N-well N-MOS transistor and connected to a drain of the third deep N-well N-MOS transistor;
   a body end of the second deep N-well N-MOS transistor is connected to a first of the fourth resistor, a second end of the fourth resistor is connected to a source of the second deep N-well N-MOS transistor and connected to a drain of the fourth deep N-well N-MOS transistor;
   a deep N-well of the third deep N-well N-MOS transistor is connected to a first end of the fifth resistor, a second end of the fifth resistor is connected to a first end of the sixth resistor and connected to the power supply voltage, a second end of the sixth resistor is connected to a deep N-well of the fourth deep N-well N-MOS transistor;
   a body end of the third deep N-well N-MOS transistor is connected to a first end of the seventh resistor, a second end of the seventh resistor is connected to a source of the third deep N-well N-MOS transistor and connected to a drain of the first N-MOS transistor;
   a body end of the fourth deep N-well N-MOS transistor is connected to a first end of the eighth resistor, a second end of the eighth resistor is connected to a source of the fourth deep N-well N-MOS transistor and connected to a drain of the second N-MOS transistor; and
   a source of the first N-MOS transistor is connected to a source of the second N-MOS transistor and grounded.

6. The power amplifier of claim 5, wherein:
   the first deep N-well N-MOS transistor and the second deep N-well N-MOS transistor are both a deep N-well normal voltage threshold thick gate oxide N-MOS transistor.

7. The power amplifier of claim 5, wherein:
   the third deep N-well N-MOS transistor and the fourth deep N-well N-MOS transistor are both a deep N-well low voltage threshold thin gate oxide N-MOS transistor.

8. The power amplifier of claim 5, wherein:
   the first N-MOS transistor and the second N-MOS transistor are both a low voltage threshold thin gate oxide N-MOS transistor.

9. An electronic device, comprising a power amplifier comprising a staggered tuning circuit and a power combining circuit comprising two differential amplifiers, wherein:
   an output end of the staggered tuning circuit is connected to an input end of the power combining circuit;
   the staggered tuning circuit is configured to:
      split a previous stage matching network and its input matching into a cascaded tuning circuit, and
      set center frequencies of parallel resonance networks of different stages to be different values defined through a setting relationship, and
      drive the power combining circuit of a subsequent stage; and the power combining circuit is configured to combine output powers of the two differential amplifiers to obtain a combined power amplification signal;

the staggered tuning circuit comprises a first amplifier, a second amplifier, a first inter-stage matching network, and a second inter-stage matching network;

an output end of the first amplifier is connected to an input end of the first inter-stage matching network;

an output end of the first inter-stage matching network is connected to an input end of the second amplifier; and an output end of the second amplifier is connected to an input end of the second inter-stage matching network.

10. The electronic device of claim 9, wherein:

the staggered tuning circuit further comprises an input matching network, an output end of the input matching network is connected to an input end of the first amplifier.

11. The electronic device of claim 9, wherein:

the setting relationship is to multiply or divide a preset frequency value and a coordination coefficient to obtain center frequencies of parallel resonance networks of different stages;

the preset frequency value is a center frequency of a working passband of the power amplifier; and the coordination coefficient is obtained according to a required system bandwidth and its in-band flatness.

12. The electronic device of claim 9, wherein:

the power combining circuit comprises a third amplifier, a fourth amplifier, and a power combining resonance network;

the third amplifier is in parallel with the fourth amplifier; and an output end of the third amplifier and an output end of the fourth amplifier are both connected to an input end of the power combining resonance network.

13. The electronic device of claim 12, wherein:

the third amplifier and the fourth amplifier are both a cascaded three-stage differential amplifier;

the third amplifier and the fourth amplifier have a same internal structure, and each comprises a first deep N-well N-MOS transistor, a second deep N-well N-MOS transistor, a third deep N-well N-MOS transistor, a fourth deep N-well N-MOS transistor, a first N-MOS transistor, a second N-MOS transistor, a first resistor, a second resistor, a third resistor, a fourth resistor, a fifth resistor, a sixth resistor, a seventh resistor, and an eighth resistor;

a deep N-well of the first deep N-well N-MOS transistor is connected to a first end of the first resistor, a second end of the first resistor is connected to a first end of the second resistor and connected to a power supply voltage, and a second end of the second resistor is connected to a deep N-well of the second deep N-well N-MOS transistor;

a body end of the first deep N-well N-MOS transistor is connected to a first end of the third resistor, a second end of the third resistor is connected to a source of the first deep N-well N-MOS transistor and connected to a drain of the third deep N-well N-MOS transistor;

a body end of the second deep N-well N-MOS transistor is connected to a first of the fourth resistor, a second end of the fourth resistor is connected to a source of the second deep N-well N-MOS transistor and connected to a drain of the fourth deep N-well N-MOS transistor;

a deep N-well of the third deep N-well N-MOS transistor is connected to a first end of the fifth resistor, a second end of the fifth resistor is connected to a first end of the sixth resistor and connected to the power supply voltage, a second end of the sixth resistor is connected to a deep N-well of the fourth deep N-well N-MOS transistor;

a body end of the third deep N-well N-MOS transistor is connected to a first end of the seventh resistor, a second end of the seventh resistor is connected to a source of the third deep N-well N-MOS transistor and connected to a drain of the first N-MOS transistor;

a body end of the fourth deep N-well N-MOS transistor is connected to a first end of the eighth resistor, a second end of the eighth resistor is connected to a source of the fourth deep N-well N-MOS transistor and connected to a drain of the second N-MOS transistor; and a source of the first N-MOS transistor is connected to a source of the second N-MOS transistor and grounded.

14. The electronic device of claim 13, wherein:

the first deep N-well N-MOS transistor and the second deep N-well N-MOS transistor are both a deep N-well normal voltage threshold thick gate oxide N-MOS transistor.

15. The electronic device of claim 13, wherein:

the third deep N-well N-MOS transistor and the fourth deep N-well N-MOS transistor are both a deep N-well low voltage threshold thin gate oxide N-MOS transistor.

16. The electronic device of claim 13, wherein:

the first N-MOS transistor and the second N-MOS transistor are both a low voltage threshold thin gate oxide N-MOS transistor.

* * * * *